United States Patent
Yen et al.

(10) Patent No.: US 10,978,547 B2
(45) Date of Patent: Apr. 13, 2021

(54) INTEGRATED INDUCTOR

(71) Applicant: Realtek Semiconductor Corporation, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 219 days.

(21) Appl. No.: 16/125,917

(22) Filed: Sep. 10, 2018

(65) Prior Publication Data
US 2019/0148479 A1    May 16, 2019

(30) Foreign Application Priority Data
Nov. 10, 2017   (TW) ................... 106139042

(51) Int. Cl.
| H01F 27/28 | (2006.01) |
| H01L 49/02 | (2006.01) |
| H01F 17/00 | (2006.01) |
| H01L 23/522 | (2006.01) |

(52) U.S. Cl.
CPC ......... *H01L 28/10* (2013.01); *H01F 17/0006* (2013.01); *H01F 17/0013* (2013.01); *H01L 23/5227* (2013.01); H01F 2017/0046 (2013.01); H01F 2017/0086 (2013.01)

(58) Field of Classification Search
USPC .......... 336/200, 223, 232, 192, 226
See application file for complete search history.

(56) References Cited

U.S. PATENT DOCUMENTS

| 6,396,362 B1* | 5/2002 | Mourant | H03H 7/42 333/25 |
| 6,608,364 B2* | 8/2003 | Carpentier | H01L 27/08 257/528 |
| 2007/0158782 A1* | 7/2007 | Heikkinen | H03F 3/45098 257/531 |
| 2011/0148733 A1* | 6/2011 | Fahs | H03H 7/42 343/859 |

(Continued)

FOREIGN PATENT DOCUMENTS

| TW | 201714278 A | 4/2017 |
| TW | I591800 B | 7/2017 |
| TW | I598899 B | 9/2017 |

OTHER PUBLICATIONS

U.S. Appl. No. 15/975,753, filed May 9, 2018.

*Primary Examiner* — Mang Tin Bik Lian
(74) *Attorney, Agent, or Firm* — Locke Lord LLP; Tim Tingkang Xia, Esq.

(57) ABSTRACT

An integrated inductor includes a first coil and a second coil. The first coil has at least one first turn disposed in a first area and at least one second turn disposed in a second area, a number of the at least one first turn is different from a number of the at least one second turn. The second coil has at least one third turn disposed in the first area and at least one fourth turn disposed in the second area, a number of the at least one third turn is different from a number of the at least one fourth turn. The number of the at least one first turn is different from the number of the at least one third turn, and the number of the at least one second turn is different from the number of the at least one fourth turn.

16 Claims, 4 Drawing Sheets

(56) References Cited

U.S. PATENT DOCUMENTS

| | | | |
|---|---|---|---|
| 2012/0244802 A1* | 9/2012 | Feng | H01F 17/0006 |
| | | | 455/41.1 |
| 2013/0257577 A1* | 10/2013 | Nazarian | H01F 5/003 |
| | | | 336/200 |
| 2014/0210044 A1* | 7/2014 | Lee | H01L 28/10 |
| | | | 257/531 |
| 2015/0170824 A1* | 6/2015 | Tesson | H01F 17/0013 |
| | | | 336/190 |
| 2017/0098500 A1 | 4/2017 | Yen et al. | |
| 2018/0102737 A1* | 4/2018 | Wu | H01L 28/10 |

\* cited by examiner

INTEGRATED INDUCTOR

CROSS-REFERENCE TO RELATED APPLICATION

This application claims priority to Taiwan Application Serial Number 106139042, filed on Nov. 10, 2017, which is herein incorporated by reference.

BACKGROUND

Technical Field

Present disclosure relates to an inductor, especially an inductor in an integrated circuit structure.

Description of Related Art

Nowadays, inductor apparatuses are essential in an integrated circuit. In current inductor apparatuses, since an eight-shaped inductor has a symmetric electrical characteristic and has two terminals able to generate magnetic fields having opposite directions, the magnetic fields generated by the eight-shaped inductor are offset with each other. As such, the eight-shaped inductor introduces fewer impacts on other parts in the integrated circuit board, and is thus difficult to be influenced by coupling from other parts or metallic segments. Therefore, the eight-shaped inductor is widely applied in an integrated circuit. However, in current approaches, it is difficult to form an eight-shaped inductor with good Q factor.

SUMMARY

Present disclosure relates to an integrated inductor. The integrated inductor comprises a first coil and a second coil. The first coil has at least one first turn disposed in a first area and at least one second turn disposed in a second area, in which a number of the at least one first turn is different from a number of the at least one second turn. The second coil has at least one third turn disposed in the first area and at least one fourth turn disposed in the second area, in which a number of the at least one third turn is different from a number of the at least one fourth turn. The number of the at least one first turn is different from the number of the at least one third turn, and the number of the at least one second turn is different from the number of the at least one fourth turn.

DETAILED DESCRIPTION

Figure 1:
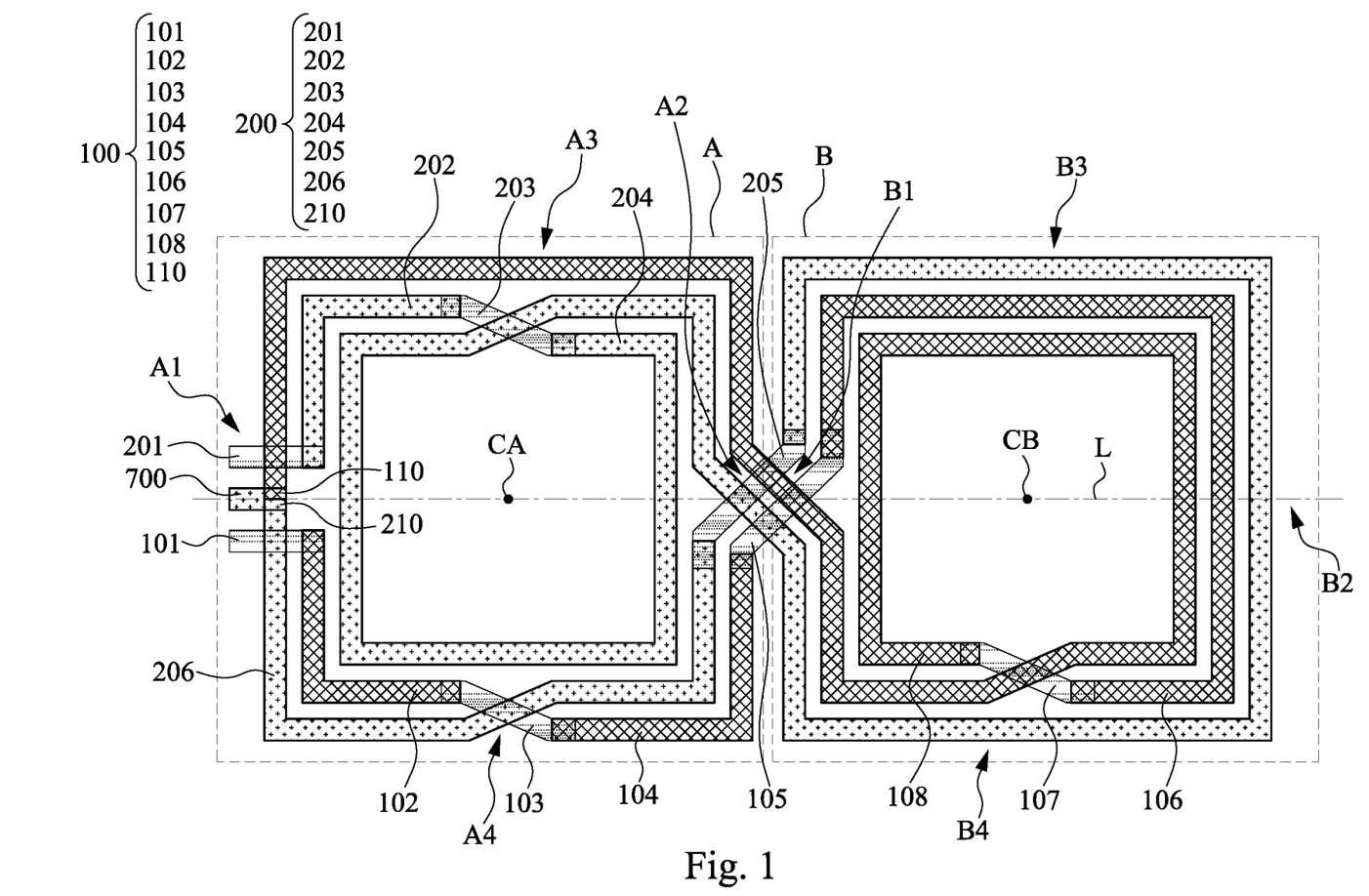
FIG. 1 is a schematic diagram of an integrated inductor according to one embodiment of present disclosure.

FIG. 1 is a schematic diagram of an integrated inductor according to one embodiment of present disclosure. In the embodiment, a top view of an integrated circuit board is illustrated. The integrated circuit board is divided into a first area A and a second area B. The first area A has a first center point CA and the second area B has a second center point CB. On a first layer of the integrated circuit board, first turns of a first coil 100 are disposed in the first area A, and second turns of the first coil 100 are disposed in the second area B. On the first layer of the integrated circuit board, first turns of a second coil 200 are disposed in the first area A, and second turns of the second coil 200 are disposed in the second area B. The first turns of the first coil 100 and those of the second coil 200 are both substantially centered at the first center point CA. The second turns of the first coil 100 and those of the second coil 200 are both substantially centered at the second center point CB.

As shown in FIG. 1, in the embodiment, the first area A has a first side A1 and a second side A2. An imaginary line L passes from the first side A1 to the second side A2 of the first area A. A third side A3 of the first area A and a fourth side A4 of the first area A are demarcated by the imaginary line L. The rectangular first area A includes three laps, which are a first lap, a second lap and a third lap, disposed along an outer-inner direction to form metallic segments of the first turns of the first coil 100 and those of the second coil 200. In the embodiment, the second area B has a first side B1, a second side B2, a third side B3 and a fourth side B4. Similarly, the imaginary line L passes from first side B1 to the second side B2 of the second area B. The rectangular second area B also includes three laps, which are a first lap, a second lap and a third lap, disposed along an outer-inner direction to form metallic segments of the second turns of the first coil 100 and those of the second coil 200.

As shown in FIG. 1, in the embodiment, the first coil 100 includes a first port 101. The first port 101 is disposed at the first side A1. Also, the first port 101 is disposed on a second layer, which is different from the first layer, of the integrated circuit board. The first coil 100 includes a metallic segment 102. The first port 101 is connected to the metallic segment 102 at the first side A1 of the first area A. The metallic segment 102 is substantially disposed on the second lap of the first area A and wound toward the fourth side A4 of the first area A in a counterclockwise manner. At the fourth side A4 of the first area A, the metallic segment 102 is connected to a metallic segment 104, via a metallic segment 103, in an interlaced manner. The metallic segment 103 is disposed on the second layer of the integrated circuit. The metallic segment 104 is substantially disposed on the first lap of the first area A and wound toward the second side A2 of the first area A in a counterclockwise manner. At the second side A2 of the first area A, the metallic segment 104 is connected to a metallic segment 106, via a metallic segment 105, in an interlaced manner. The metallic segment 105 is disposed on the second layer of the integrated circuit as well.

The metallic segment 106 is substantially disposed on the second lap of the second area B. The metallic segment 106 winds from the first side B1, the third side B3, the second side B2, to the fourth side B4 of the second area B in a clockwise manner. At the fourth side B4 of the second area B, the metallic segment 106 is connected to a metallic segment 108, via a metallic segment 107, in an interlaced manner. The metallic segment 108 is substantially disposed on the third lap of the second area B. The metallic segment 108 winds from the fourth side B4 of the second area B back to the fourth side B4 of the second area B in a clockwise manner, based on the second center point CB. At the fourth side B4 of the second area B, the metallic segment 108 winds back to the second lap of the second area B. On the second lap of the second area B, the metallic segment 108 winds to the first side B1 of the second area B in a clockwise manner. At the first side B1 of the second area B, the metallic segment 108 winds to the first lap of the first area A. The metallic segment 108 winds from the second side A2 of the first area A to the first side A1 of the first area A in a counterclockwise manner. At the first side A1 of the first area A, the metallic segment 108 is connected to a second port 110, in which the second port 110 is disposed on the second layer of the integrated circuit board. With the configuration mentioned above, the first port 101, the metallic segments 102-108 and the second port 110 forms the first coil 100. However, it is noted that the configuration shown in this example is given for illustrative purposes, and the present disclosure is not limited thereto. In an alternative example, the metallic segment 106 may be connected to the metallic segment 108, via the metallic segment 107, at the second side B2 or the third side B3 of the second area B.

As shown in FIG. 1, in the embodiment, the second coil 200 includes a third port 201. The third port 201 is disposed at the first side A1 of the first area A and disposed on the second layer of the integrated circuit board. The second coil 200 includes a metallic segment 202. At the first side A1 of the first area A, the third port 201 is connected to the metallic segment 202. The metallic segment 102 winds toward the third side A3 of the first area A, along the second lap of the first area A, in a clockwise manner. At the third side A3 of the first area A, the metallic segment 202 is connected to a metallic segment 204, via a metallic segment 203 that is disposed on the second layer of the integrated circuit board. On the third lap of the first area A, the metallic segment 204 winds toward the third side A3 of the first area A based on the first center point CA. At the third side A3 of the first area A, the metallic segment 204 winds to the second lap of the first area A in an interlaced manner. Along the second lap of the first area A, the metallic segment 204 winds toward the second side A2 of the first area A in a clockwise manner. At the second side A2 of the first area A, the metallic segment 204 winds to the first lap of the first area A in an interlaced manner.

The metallic segment 204 winds from the first side B1 of the second area B back to the first side B1 of the second area B in a counterclockwise manner, based on the second center point CB. At the first side B1 of the second area B, the metallic segment 204 is connected to a metallic segment 206 via a metallic segment 205 that is disposed on the second layer of the integrated circuit board. The metallic segment 206 is substantially disposed on the second lap of the first area A. The metallic segment 206 winds toward the fourth side A4 of the first area A along the second lap of the first area A. At the fourth side A4 of the first area A, the metallic segment 206 winds to the first lap of the first area A in an interlaced manner. Along the first lap of the first area A, the metallic segment 206 winds toward the first side A1 of the first area A. At the first side A1 of the first area A, the metallic segment 206 is connected to a fourth port 210, in which the fourth port 210 is disposed on the second layer of the integrated circuit as well. With the configuration mentioned above, the third port 201, the metallic segments 202-206 and the fourth port 210 forms the second coil 200.

As shown in FIG. 1, in the embodiment, the first coil 100 substantially includes three turns, some of them (i.e., first turns) are disposed in the first area A, and some of them (i.e., second turns) are disposed in the second area B. In greater detail, a number of the first turns of the first coil 100 is 1, and a number of the second turns of the first coil 100 is 2. It is to say, a first ratio of the first turns and the second turns of the first coil 100 is 1:2. In the embodiment, the second coil 200 substantially includes three turns as well, some of them (i.e., first turns) are disposed in the first area A, and some of them (i.e., second turns) are disposed in the second area B. In greater detail, a number of the first turns of the second coil 200 is 2, and a number of the second turns of the second coil 200 is 1. It is to say, a second ratio of the first turns and the second turns of the second coil 200 is 2:1. In the embodiment, the first ratio is inversely proportional to the second ratio. It means that the number of the first turns of the first coil 100 is inversely proportional to those of the second coil 200, and the number of the second turns of the first coil 100 is inversely proportional to those of the second coil 200.

In the embodiment, parts of the first coil 100 are disposed on the first lap of the first area A, and parts of the second coil 200 are disposed on the second lap and the third lap of the first area A. In this case, third-fourths of an outer lap (i.e., the first lap) of the first area A is substantially formed with the first turns of the first coil 100, and an one-fourth of the outer lap of the first area A is substantially formed with the first turns of the second coil 200. In the embodiment, parts of the first coil 100 are disposed on the second lap and the third lap of the second area B, and parts of the second coil 200 are disposed on the first lap of the second area B. In this case, an outer lap (i.e., the first lap) of the second area B is substantially formed with the second turns of the second coil 200.

As shown in FIG. 1, in the embodiment, the second port 110 of the first coil 100 and the fourth port 210 of the second coil 200 are connected to a center tap 700 at the first side A1 of the first area A. The center tap 700 is disposed on the first layer of the integrated circuit board. The center tap 700 is also disposed between the first port 101 and the third port 201. It is noted that in conventional approaches, the input/output port and the center tap of the inductor structure are mostly disposed at opposite sides of the inductor structure. Thus, if signals from the input/output port and the center tap of the inductor structure are expected to be obtained from a same side of the inductor structure, a jumper wire arranged from the center tap and across the entire inductor structure is required, which can be considered as an extension of the center tap. In comparison, the inductor structure of present disclosure is formed by the first coil 100 and the second coil 200, the first port 101 and the third port 201 thereof are disposed at the same side of the inductor structure, and the center tap 700 is disposed at that side as well. In other words, the input/output ports and the center tap of the present disclosure are disposed at the same side of the inductor structure. However, although the input/output ports and the center tap of the present disclosure are disposed at the same side of the inductor structure, by setting an extension metallic segment on a third layer of the integrated circuit board, it is possible to obtain the signal from the center tap to another side of the the inductor structure in another embodiment. Moreover, in other embodiments, two extension metallic segments can be settled on the second layer and the third layer of the integrated circuit, respectively, to transmit the signal from the center tap to another side of the the inductor structure. As such, the signal from the center tap can be measured at another side of the inductor structure.

As shown in the embodiments of present disclosure, the input/output ports and the center tap of the inductor structure are disposed at the same side and thus address the problems of prior arts. The inductor structure of present disclosure is electrically symmetric, and a Q factor of the inductor structure is improved when compared with the Q factor of the prior arts.

Figure 2:
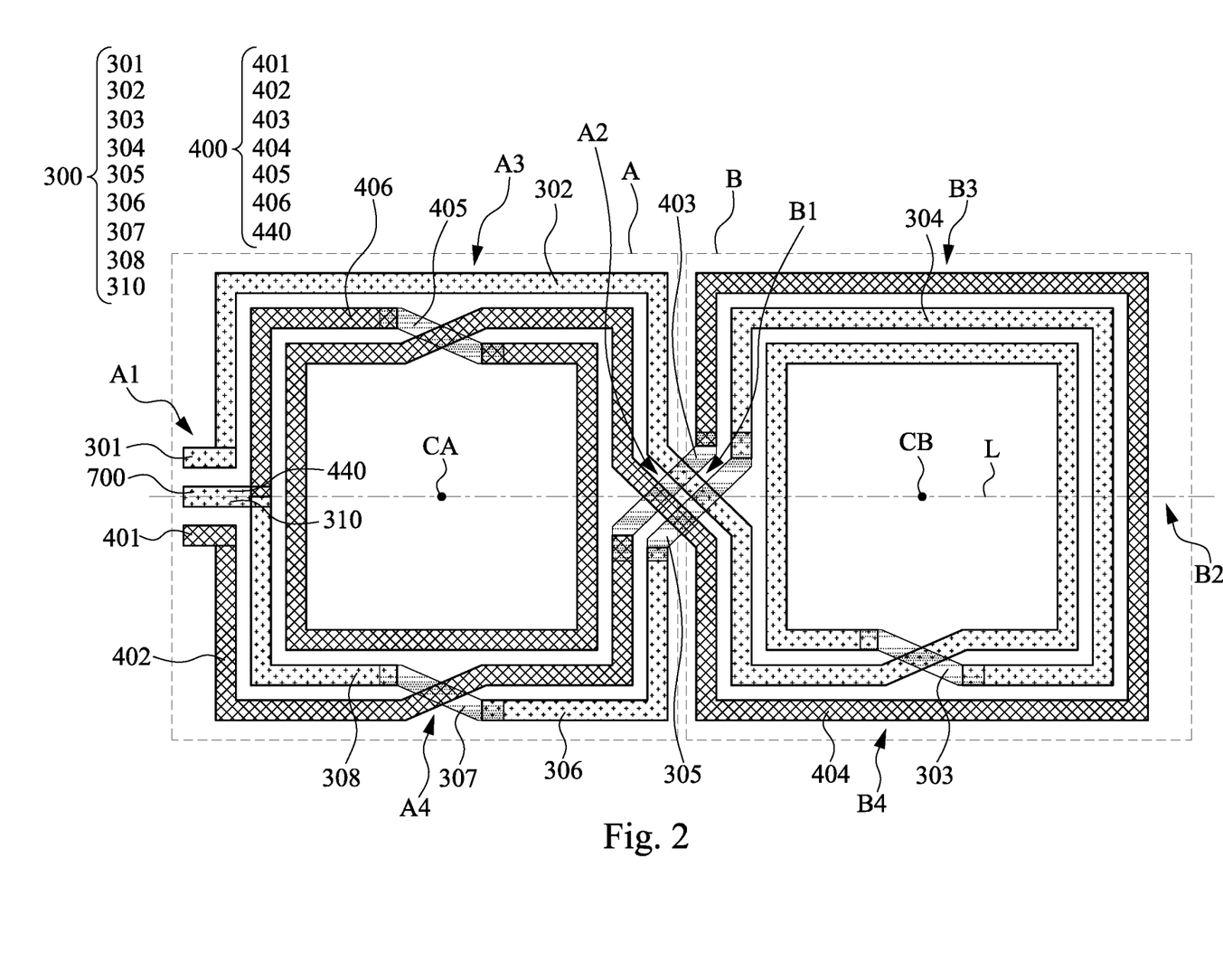
FIG. 2 is a schematic diagram of an integrated inductor according to one embodiment of present disclosure.

FIG. 2 is a schematic diagram of an integrated inductor according to one embodiment of present disclosure. In the embodiment, a top view of an integrated circuit board is illustrated. Similar to the embodiment of FIG. 1, in the embodiment, two areas, which are the first area A and the second area B are demarcated on the integrated circuit board. A first coil 300 and a second coil 400 are disposed in each of the first area A and the second area B in a spiral manner.

Different from the embodiment shown in FIG. 1, in the embodiment, the starting points of these coils, which are the first port 301 of the first coil 300 and the third port 401 of the second coil 400, are connected to the first lap of the first area A at the first side A1 of the first area A. Terminals of these coils, which are the second port 310 of the first coil 300 and the fourth port 410 of the second coil 400, are connected to the first lap of the first area A at the first side A1 of the first area A.

As shown in FIG. 2, in the embodiment, the first coil 300 includes two first turns disposed in the first area A and one second turn disposed in the second area B. In other words, a first ratio of the first turns and the second turn of the first coil 300 is 2:1. The second coil 400 includes one first turn disposed in the first area A and two second turns disposed in the second area B. In other words, a second ratio of the first turns and the second turns of the second coil 400 is 1:2.

In the embodiment, parts of the first coil 300 are disposed on the second lap and the third lap of the first area A, and parts of the second coil 400 are disposed on the first lap of the first area A. In this case, the first turns of the first coil 300 are substantially surrounded by the first turns of the second coil 400 by third-fourths laps. In the embodiment, parts of the first coil 300 are disposed on the first lap of the second area B, and parts of the second coil 400 are disposed on the second lap and the third lap of the second area B. In this case, an outer lap (i.e., the first lap) of the second area B is substantially formed with the second turns of the second coil 400.

As shown in FIG. 2, in the embodiment, the second port 310 of the first coil 300 and the fourth port 410 of the second coil 400 are connected to the center tap 700 at the first side A1 of the first area A. The center tap 700 is disposed on the first layer of the integrated circuit board. The center tap 700 is also disposed between the first port 301 and the third port 401. Similar to the embodiment shown in FIG. 1, the input/output ports and the center tap of the present disclosure are all disposed at the same side of the inductor structure.

Figure 3:
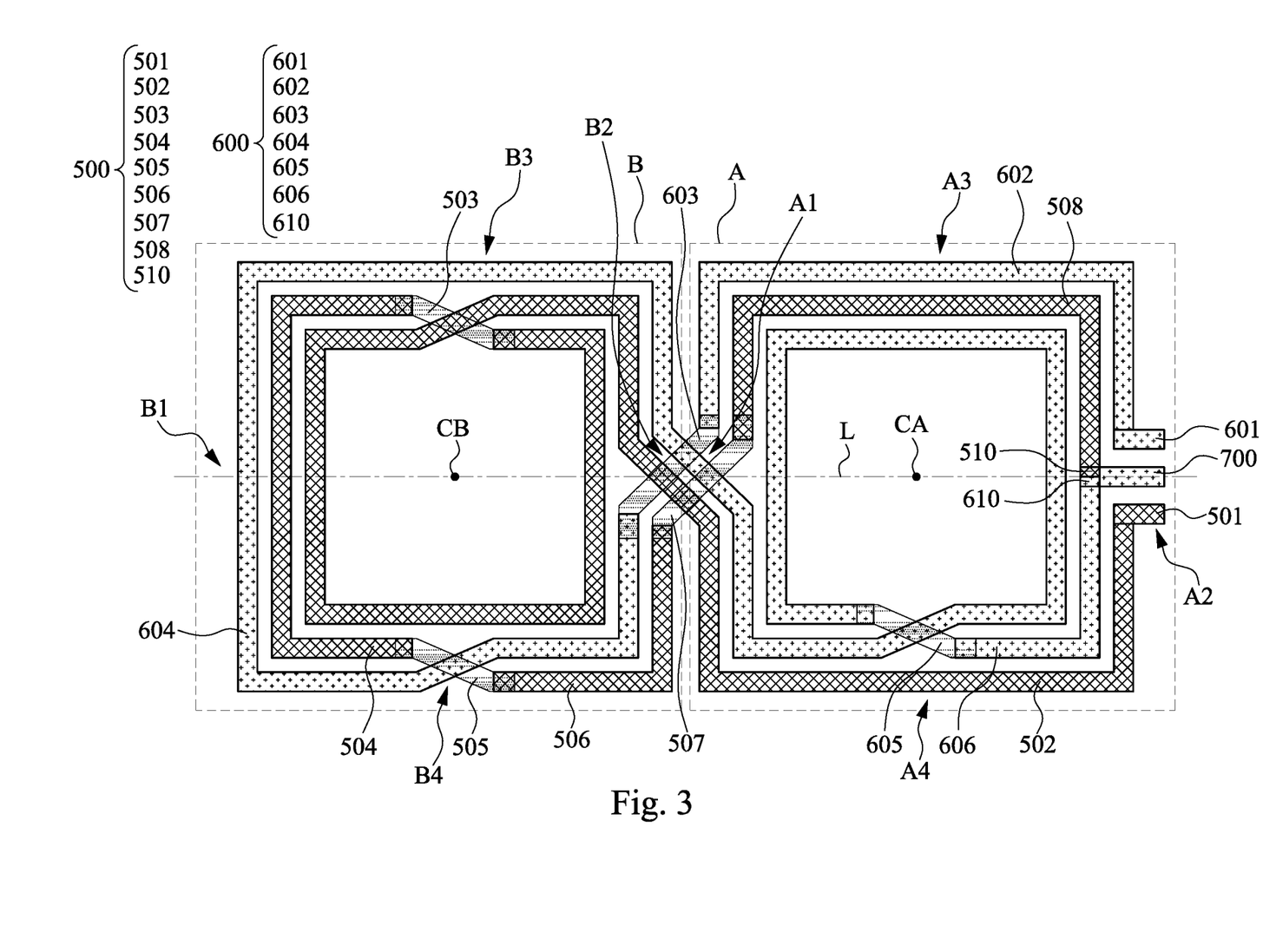
FIG. 3 is a schematic diagram of an integrated inductor according to one embodiment of present disclosure.

FIG. 3 is a schematic diagram of an integrated inductor according to one embodiment of present disclosure. In the embodiment, a top view of an integrated circuit board is illustrated. Similar to the embodiment of FIG. 1 and FIG. 2, in the embodiment, the first area A and the second area B are demarcated on the integrated circuit board. It is noted, in the embodiment, the configuration of the first area A and the second area B are exchanged. A first coil 500 and a second coil 600 are disposed in each of the first area A and the second area B in a spiral manner.

Different from the embodiment shown in FIG. 1 and FIG. 2, in the embodiment, the starting points of these coils, which are the first port 501 of the first coil 500 and the third port 601 of the second coil 600, are connected to the first lap of the first area A at the first side A1 of the first area A. Terminals of these coils, which are the second port 510 of the first coil 500 and the fourth port 610 of the second coil 600, are connected to the first lap of the first area A at the first side A1 of the first area A.

As shown in FIG. 3, in the embodiment, the first coil 500 includes one first turn disposed in the first area A and two second turns disposed in the second area B. In other words, a first ratio of the first turns and the second turns of the first coil 500 is 1:2. The second coil 500 includes two first turns disposed in the first area A and one second turn disposed in the second area B. In other words, a second ratio of the first turns and the second turns of that the second coil 500 is 2:1.

In the embodiment, in the first area A, around half of the first turns of the first coil 500 are disposed on the first lap, and another half are disposed on the second lap. On the other hand, the first turns of the second coil 600 are substantially disposed on the second lap and the third lap in the first area A. However, around quarters of the first turns of the second coil 600 is disposed on the first lap of the first area A. In this case, an outer lap (i.e., the first lap) of the first area A is averagely formed with the first turns of the first coil 500 and the first turns of the second coil 600. In the embodiment, in the second area B, the second turns of the first coil 500 are substantially disposed on the second lap and the third lap, and the second turns of the second coil 600 are substantially disposed on the first lap. In this case, third-fourths of an outer lap (i.e., the first lap) of the second area B is substantially formed with the second turns of the second coil 600.

As shown in FIG. 2, in the embodiment, the second port 510 of the first coil 500 and the fourth port 610 of the second coil 600 are connected to the center tap 700 at the first side A1 of the first area A. The center tap 700 is disposed on the first layer of the integrated circuit board. The center tap 700 is also disposed between the first port 501 and the third port 601. Similar to the embodiment shown in FIG. 1, the input/output ports and the center tap of the present disclosure are all disposed at the same side of the inductor structure.

Figure 4:
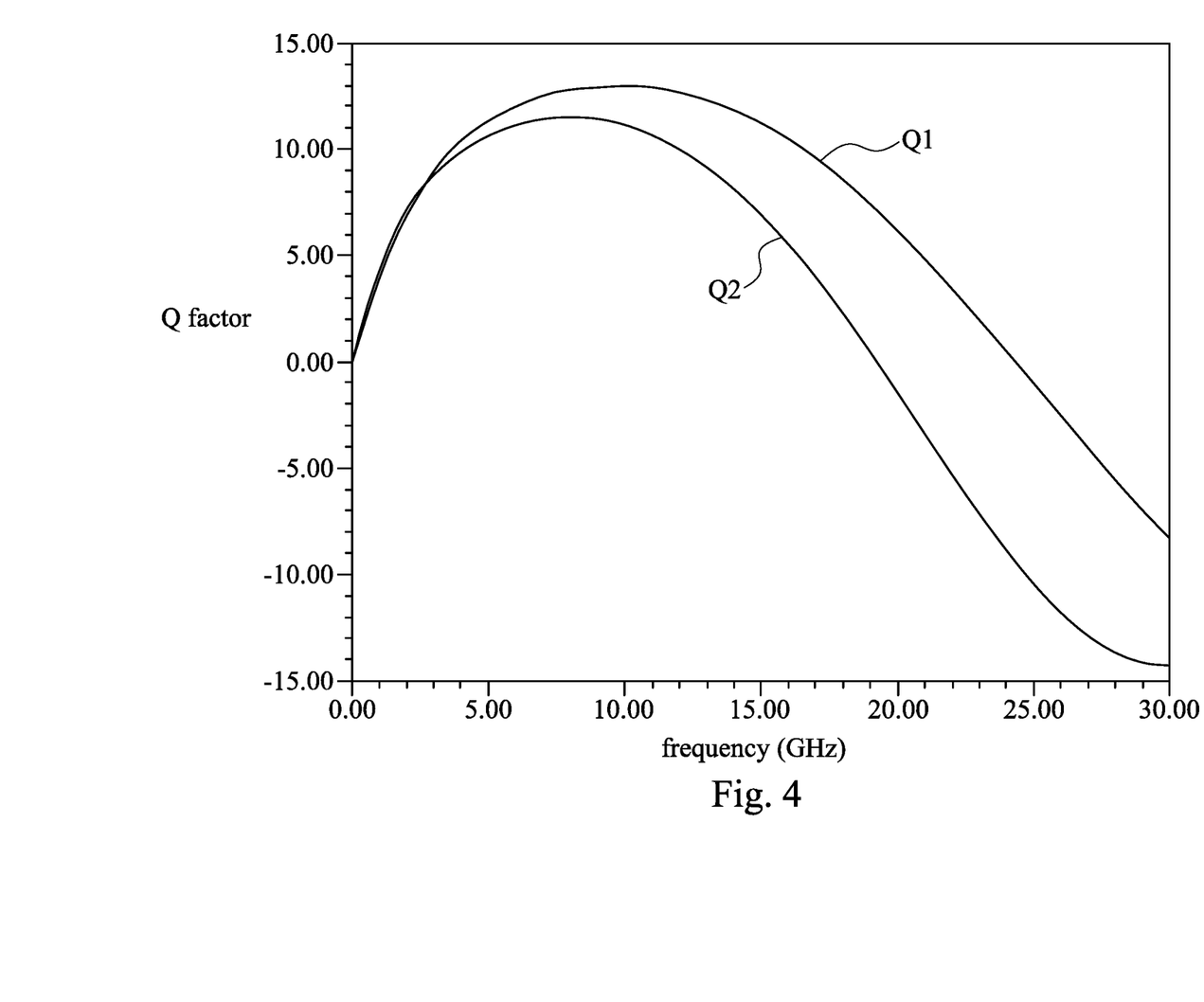
FIG. 4 is a schematic diagram showing an experiment result of an integrated inductor according to one embodiment of present disclosure.

FIG. 4 is a schematic diagram showing an experiment result of an integrated inductor according to one embodiment of present disclosure. As shown in FIG. 4, the horizontal axis indicates frequencies, and the vertical axis indicates the value of Q factors. The curve Q1 shows the Q factor obtained from one integrated inductor in aforementioned embodiments. The curve Q2 shows the Q factor obtained from one integrated inductor in prior arts. Apparently, when the frequency is higher than 3 GHz, the curve Q1 is higher than the curve Q2. More particularly, the difference between theses curves Q1 and Q2 becomes larger at higher frequencies. As shown in the figure, it is evident that the Q factors measured on the integrated inductor of present disclosure are better than the Q factors measured on prior arts.

As shown in foregoing embodiments, the integrated inductor of present disclosure includes the first coil and the second coil. In each of the first area and the second area, the first coil and the second coil include different numbers of turns. Nevertheless, the first coil and the second coil are electrically symmetric. Furthermore, the input/output ports and the center tap of these two coils are disposed at the same side of the inductor structure. This configuration addresses the problems from prior arts and provides better Q factors than the prior arts. Moreover, in some embodiments of present disclosure, in order to adjust the inductance value of the integrated inductor, the numbers of turns that each of the first and second coil being disposed in the two areas can be modified.

What is claimed is:
1. An integrated inductor, comprising:
 a first coil having at least one first turn disposed in a first area and at least one second turn disposed in a second area, a number of the at least one first turn is different from a number of the at least one second turn; and a second coil having at least one third turn disposed in the first area and at least one fourth turn disposed in the second area, a number of the at least one third turn is different from a number of the at least one fourth turn;

wherein the number of the at least one first turn is different from the number of the at least one third turn, and the number of the at least one second turn is different from the number of the at least one fourth turn;

wherein the first coil comprises a first port and a second port, the second coil comprises a third port and a fourth port, and the integrated inductor further comprises a center tap, and the center tap, the first port, the second port, the third port, and the fourth port are disposed on the same side;

wherein the first area has two opposite sides, which are a first side and a second side, the second side of the first area is adjacent to the second area, the second port and the fourth port are coupled to the center tap on the first side, and the center tap is disposed between the first port and the third port;

wherein the number of the at least one first turn and the number of at least one second turn is in a first ratio, the number of the at least one third turn and the number of at least one fourth turn is in a second ratio, and the first ratio is inversely proportional to the second ratio;

wherein the first ratio is 1:2.

2. The integrated inductor of claim 1, wherein a third-fourths of an outer lap of the first area is substantially formed with the at least one first turn of the first coil, and an outer lap of the second area is substantially formed with the at least one fourth turn of the second coil.

3. The integrated inductor of claim 1, wherein a half of an outer lap of the first area is substantially formed with the at least one first turn of the first coil, and a third-fourths of an outer lap of the second area is substantially formed with the at least one fourth turn of the second coil.

4. The integrated inductor of claim 1, wherein the first ratio is 2:1.

5. The integrated inductor of claim 4, wherein an outer lap of the second area is substantially formed with the at least one second turn of the first coil, and a third-fourths of an outer lap of the first area is substantially formed with the at least one first turn of the second coil.

6. The integrated inductor of claim 1, wherein each of the first area and the second area comprises a first lap, a second lap, and a third lap, the first, second and third laps are concentrically located at each of the first area and the second area, the first lap is outermost, the third lap is innermost, the second lap is between the first lap and the third lap, the at least one first turn and the at least one third turn are disposed on the first, second and third laps of the first area, and the at least one second turn and the at least one fourth turn are disposed on the first, second and third laps of the second area;

an imaginary line is extended from the first side of the first area to the second side of the first area, the imaginary line passes the first side of the first area, a first center point, the second side of the first area, a first side of the second area, a second center point, and a second side of the second area, a third side of the first area and a fourth side of the first area are demarcated by the imaginary line, a third side of the second area and a fourth side of the second area are demarcated by the imaginary line, so that the third side and the fourth side of each of the first area and the second area are parallel to the imaginary line.

7. The integrated inductor of claim 6, wherein the at least one first turn of the first coil and the at least one third turn of the second coil are centered at the first center, and the at least one second turn of the first coil and the at least one fourth turn of the second coil are centered at the second center.

8. The integrated inductor of claim 6, wherein the first coil is sequentially arranged from the first port, the second lap and the first lap of the first area, the second lap and the third lap of the second area, the second lap of the second area, the first lap of the first area, to the second port, wherein in the second area, the first coil is disposed around the second center point, and in order to bridge the first coil, the second lap of the first area is connected to the first lap of the first area at the fourth side of the first area in an interlaced manner, the first lap of the first area is connected to the second lap of the second area at the second side of the first area in an interlaced manner, the second lap of the second area is connected to the third lap of the second area at the fourth side of the second area in an interlaced manner, the third lap of the second area is connected to the second lap of the second area at the fourth side of the second area in an interlaced manner, and the second lap of the second area is connected to the first lap of the first area at the first side of the second area in an interlaced manner.

9. The integrated inductor of claim 8, wherein the first port and the second port of the first coil are disposed on different layers of an integrated circuit board.

10. The integrated inductor of claim 6, wherein the second coil is sequentially arranged from the third port, the second lap and the third lap of the first area, the second lap of the first area, the first lap of the second area, the second lap and the first lap of the first area, to the fourth port, wherein in the first area, the second coil is disposed around the first center point, and in the second area, the second coil is disposed around the second center point, and in order to bridge the second coil, the second lap of the first area is connected to the third lap of the first area at the third side of the first area in an interlaced manner, the third lap of the first area is connected to the second lap of the first area at the third side of the first area in an interlaced manner, the second lap of the first area is connected to the first lap of the second area at the second side of the first area in an interlaced manner, the first lap of the second area is connected to the second lap of the first area at the first side of the second area in an interlaced manner, and the second lap of the first area is connected to the first lap of the first area at the fourth side of the first area in an interlaced manner.

11. The integrated inductor of claim 10, wherein the third port and the fourth port of the second coil are disposed on different layers of an integrated circuit board.

12. The integrated inductor of claim 6, wherein the first coil is sequentially arranged from the first port, the first lap and the second lap of the first area, the first lap of the second area, the second lap and the third lap of the first area, the second lap of the first area, to the second port, wherein in the first area, the first coil is disposed around the first center point, and in the second area, the first coil is disposed around the second center point, and in order to bridge the first coil, the first lap of the first area is connected to the second lap of the first area at the fourth side of the first area in an interlaced manner, the second lap of the first area is connected to the first lap of the second area at the second side of the first area in an interlaced manner, the first lap of the second area is connected to the second lap of the first area at the first side of the second area in an interlaced manner, the second lap of the first area is connected to the third lap of the first area at the third side of the first area in an interlaced manner, and the third lap of the first area is connected to the second lap of the first area at the third side of the first area in an interlaced manner.

13. The integrated inductor of claim 6, wherein the second coil is sequentially arranged from the third port, the first lap of the first area, the second lap and the third lap of the second area, the second lap of the second area, the first lap and the second lap of the first area, to the fourth port, wherein in the second area, the second coil is disposed around the second center point, and in order to bridge the second coil, the first lap of the first area is connected to the second lap of the second area at the second side of the first area in an interlaced manner, the second lap of the second area is connected to the third lap of the second area at the fourth side of the second area in an interlaced manner, the third lap of the second area is connected to the second lap of the second area at the fourth side of the second area in an interlaced manner, the second lap of the second area is connected to the first lap of the first area at the first side of the second area in an interlaced manner, and the first lap of the first area is connected to the second lap of the first area at the fourth side of the first area in an interlaced manner.

14. The integrated inductor of claim 6, wherein the first coil is sequentially arranged from the first port, the first lap of the first area, the second lap and the third lap of the second area, the second lap and the first lap of the second area, the second lap of the first area, to the second port, wherein in the second area, the first coil is disposed around the second center point, and in order to bridge the first coil, the first lap of the first area is connected to the second lap of the second area at the second side of the first area in an interlaced manner, the second lap of the second area is connected to the third lap of the second area at the third side of the second area in an interlaced manner, the third lap of the second area is connected to the second lap of the second area at the third side of the second area in an interlaced manner, the second lap of the second area is connected to the first lap of the second area at the fourth side of the second area in an interlaced manner, and the first lap of the second area is connected to the second lap of the first area at the first side of the second area in an interlaced manner.

15. The integrated inductor of claim 6, wherein the second coil is sequentially arranged from the third port, the first lap of the first area, the second lap and the first lap of the second area, the second lap and the third lap of the first area, the second lap of the first area, to the fourth port, wherein in the second area, the second coil is disposed around the second center point, and in order to bridge the second coil, the first lap of the first area is connected to the second lap of the second area at the second side of the first area in an interlaced manner, the second lap of the second area is connected to the first lap of the second area at the fourth side of the second area in an interlaced manner, the first lap of the second area is connected to the second lap of the first area at the first side of the second area in an interlaced manner, the second lap of the first area is connected to the third lap of the first area at the fourth side of the first area in an interlaced manner, and the third lap of the first area is connected to the second lap of the first area at the fourth side of the first area in an interlaced manner.

16. The integrated inductor of claim 1, wherein the first area and the second area are disposed on the same layer and the first area is disposed adjacent to the second area.

* * * * *